United States Patent [19]
Nakamura

[11] Patent Number: 6,133,609
[45] Date of Patent: Oct. 17, 2000

[54] HIGH-VOLTAGE THIN-FILM TRANSISTOR WITH SUB-GATE ELEMENTS

[75] Inventor: Kenichi Nakamura, Tokyo, Japan

[73] Assignee: NEC Corporation, Tokyo, Japan

[21] Appl. No.: 09/251,455

[22] Filed: Feb. 17, 1999

[30] Foreign Application Priority Data

Feb. 18, 1998 [JP] Japan .................................. 10-035300

[51] Int. Cl.[7] ..................................................... H01L 29/00
[52] U.S. Cl. .......................... 257/347; 347/250; 347/331; 347/346; 347/365; 347/366
[58] Field of Search ..................................... 257/250, 331, 257/346, 365, 366, 347

[56] References Cited

U.S. PATENT DOCUMENTS 5,475,238  12/1995  Hamada ..................................... 257/66

OTHER PUBLICATIONS

T. Huang et al., "A Simpler 100–V Polysilicon TFT with Improved Turn –On Characteristics", IEEE Electron Devices Letters, vol. 11, No. 6, Jun. 1990, pp. 244–246 with English Abstract.

*Primary Examiner*—Fetsum Abraham
*Attorney, Agent, or Firm*—Sughrue, Mion, Zinn, Macpeak & Seas, PLLC

[57] ABSTRACT

Disclosed is a thin-film transistor which can be operated even if a high voltage is applied thereto. The thin-film transistor consists of a first and a second thin-film transistor. Each thin-film transistor has an offset region between an active region and a drain region whose conductivity is controlled by a sub-gate electrode. Each thin-film transistor has a sub-gate insulator between a sub-gate electrode and the offset region which is thicker than a main-gate insulator between the main-gate electrode and the active region. The thickness of the main-gate insulator of the second thin-film transistor is thicker than the thickness of the main-gate insulator of the first thin-film transistor.

3 Claims, 5 Drawing Sheets

HIGH-VOLTAGE THIN-FILM TRANSISTOR WITH SUB-GATE ELEMENTS

BACKGROUND OF THE INVENTION (i) Field of the Invention

The present invention relates to a high-voltage thin-film transistor and its manufacture method, especially to a high-voltage thin-film transistor constituting a thin-film circuit formed on an insulating substrate and an insulating layer.

(ii) Description of the Related Art

A high-voltage thin-film transistor is used to constitute a thin-film transistor which can be operated even if a high drain voltage is applied thereto. Conventional high-voltage thin-film transistor is disclosed in an article entitled "A Simpler 100-V Polysilicon TFT with Improved Turn-On Characteristics" by T. Y. Huang in IEEE Electron Devices Letters, pages 244 to 246, vol. 11, no. 6 (June 1990).

Specifically, as shown in FIG. 1, in the conventional high-voltage thin-film transistor, a source region 301, a drain region 302, and an active region 303 are formed on a substrate 300.

A main-gate electrode 305 is formed on a main-gate insulating layer 304 with thickness of 100 nm overlapping the active region 303. An offset region 306 with no impurities doped therein is formed between the active region 303 and the drain region 302. A sub-gate electrode 308 is formed on an interlayer insulating film 307 with thickness of 700 nm overlapping the offset region 306.

Operation of the aforementioned high-voltage thin-film transistor will be described with reference to FIG. 1. The conductivity of the offset region 306 can be controlled by a voltage applied to the sub-gate electrode 308. The drain electric field can be moderated by setting the sub-gate voltage to an appropriate value.

In the article, when a voltage slightly larger than the half of the drain voltage is applied, the drain electric field can be distributed at both ends of the offset region 306, so that dielectric breakdown properties can be optimized.

It is difficult to control a voltage of about 100V using such a high-voltage thin-film transistor to transmit a signal with amplitude of 5V to the main-gate electrode 304. In the article, when the drain voltage of about 100V is applied, the voltage applied to the sub-gate electrode is set to about 60V, but in order to prevent dielectric breakdown, the sub-gate insulating layer needs to be formed as thick as about 700 nm.

In this case, since the sub-gate insulating layer is thick, the density of charges induced to the offset region 306 is lowered and the resistance is raised, which causes a current pinching phenomenon.

SUMMARY OF THE INVENTION

An object of the present invention is to provide a high-voltage thin-film transistor which can obtain high ON current.

To attain this and other objects, the present invention provides a high-voltage thin-film transistor in which a first thin-film transistor comprises a first active region, a first offset region, a first source region and a first drain region formed in the same layer as the first active region, a first insulating layer formed to cover the first active region, a first electrode formed on the first insulating layer overlapping the first active region, a second insulating layer formed to cover at least the first offset region, and a second electrode formed on the second insulating layer overlapping the first offset region. The first electrode is formed as a main-gate electrode, and the second electrode is formed as a sub-gate electrode.

A second thin-film transistor comprises a second active region, a second offset region, a second source region and a second drain region formed in the same layer as the second active region, a third insulating layer formed to cover the second active region, a third electrode formed on the third insulating layer overlapping the second active region, a fourth insulating layer formed to cover at least the second offset region, and a fourth electrode formed on the fourth insulating layer overlapping the second offset region. The third electrode is formed as a main-gate electrode, and the fourth electrode is formed as a sub-gate electrode. The first and second thin-film transistors are formed on one of the same insulating substrate and the same insulating layer. The second insulating layer and the third insulating layer are formed in the same layer.

The present invention provides a method of manufacturing a high-voltage thin-film transistor comprising first and second thin-film transistors. The method comprises steps of forming a first source region and a first drain region of the first thin-film transistor and a second source region and a second drain region of the second thin-film transistor on one of the same insulating substrate and the same insulating layer; forming a first active region and a first offset region in the same layer as the first source region and the first drain region and forming a second active region and a second offset region in the same layer as the second source region and the second drain region; forming a first insulating layer to cover the first active region; forming a first electrode on the first insulating layer overlapping the first active region; forming a second insulating layer to cover at least the first offset region and forming a third insulating layer to cover at least the second active region; forming a second electrode on the second insulating layer overlapping the first offset region and forming a third electrode on the third insulating layer overlapping the second active region; forming a fourth insulating layer to cover at least the second offset region; and forming a fourth electrode on the fourth insulating layer overlapping the second offset region. The first electrode is formed as a main-gate electrode of the first thin-film transistor, and the second electrode is formed as a sub-gate electrode of the first thin-film transistor, while the third electrode is formed as a main-gate electrode of the second thin-film transistor, and the fourth electrode is formed as a sub-gate electrode of the second thin-film transistor.

The first and second thin-film transistors are formed on the same insulating substrate or the same insulating layer. The second and third insulating layers are formed in the same layer.

Moreover, in the first and second thin-film transistors, when thickness of the insulating layer between the first active region and the first electrode is d1m, thickness of the insulating layer between the second active region and the third electrode is d1s, thickness of the insulating layer between the first offset region and the second electrode is d2m, and thickness of the insulating layer between the second offset region and the forth electrode is d2s, respectively, they are formed to have the relationship of d1s>d1m and d2s>d2m.

When the second and third insulating layers have the same thickness, d2s>d2m, d2m nearly equals d1s and d1s>d1m. In the conventional high-voltage thin-film transistor, only two values of thickness can be set in the main-gate and sub-gate insulating layer. But in the present invention, at least three values of thickness can be set in the main-gate and sub-gate insulating layer of the two thin-film transistors, resulting in decrease of the electric field between each electrodes.

DETAILED DESCRIPTION OF THE PREFERRED EMBODIMENT

Figure 1:
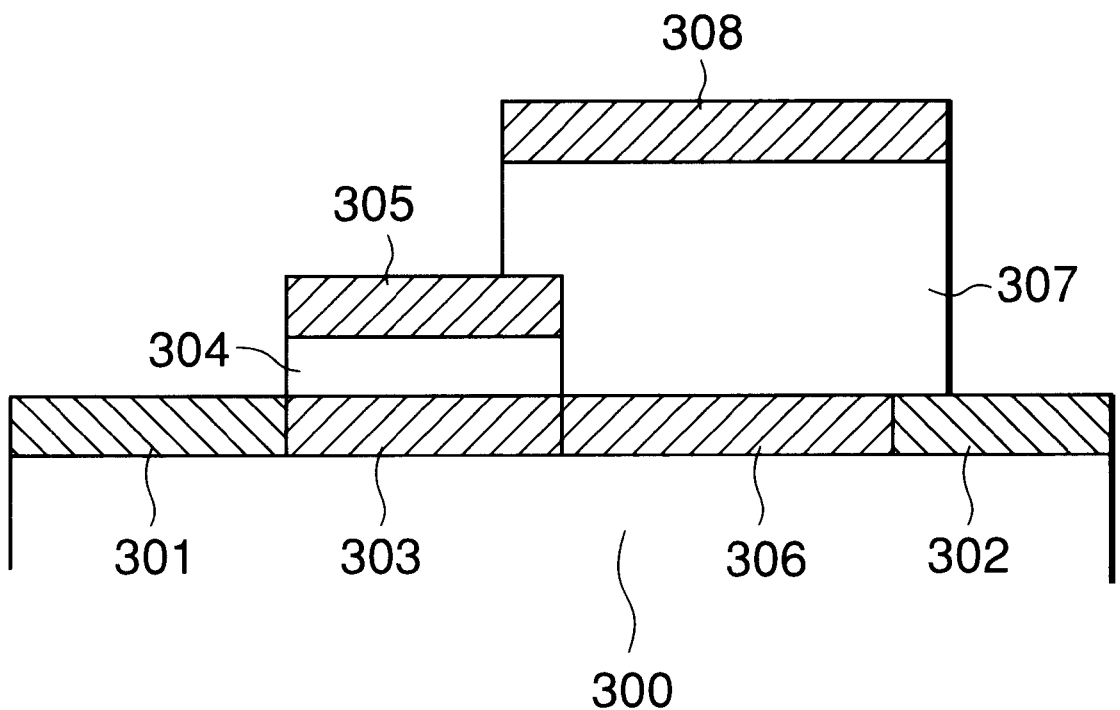
FIG. 1 is a sectional view showing a conventional high-voltage thin-film transistor.
Figure 2:
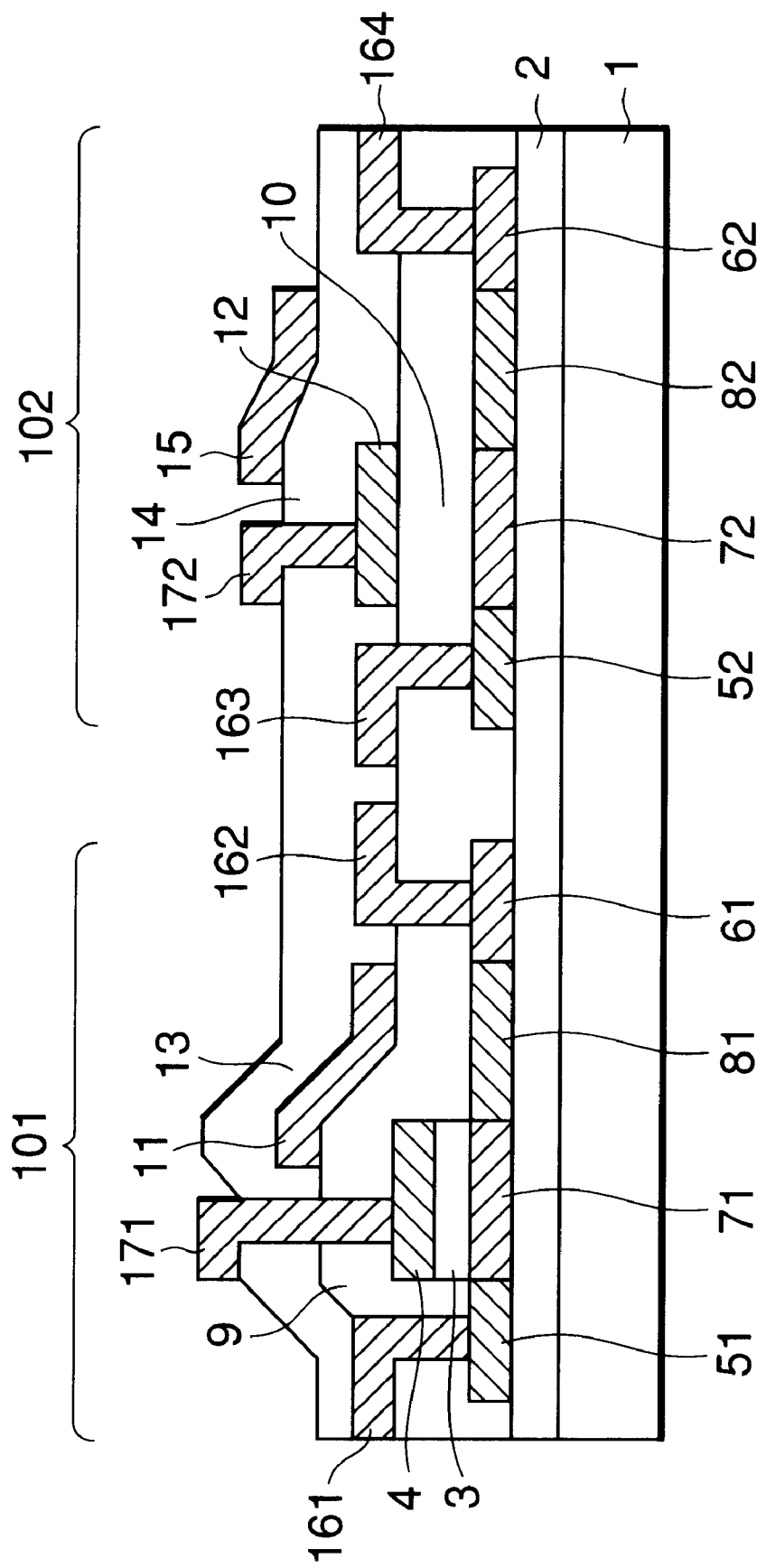
FIG. 2 is a sectional view showing a high-voltage thin-film transistor according to one embodiment of the present invention.

An embodiment of the present invention will next be described in detail with reference to the accompanying drawings. FIG. 2 is a sectional view showing a structure according to one embodiment of the present invention. As shown in FIG. 2, a high-voltage thin-film transistor of the present invention comprises a first thin-film transistor (TFT) 101 and a second TFT 102. A case where both the first TFT 101 and the second TFT 102 are of NMOS (N-type Metal Oxide Semiconductor) TFT will be described hereinafter.

The first TFT 101 will first be described. A first source region 51 and a first drain region 61 each containing impurities in high concentration and having a low resistance, and a first active region 71 and a first offset region 81 each hardly containing impurities are formed on a part of a semiconductor layer formed on a glass substrate 1 covered with a capping layer 2.

A first electrode 4 serving as a main-gate electrode is formed on a first insulating layer 3 serving as a main-gate insulating layer overlapping the first active region 71. Moreover, a second electrode 11 serving as a sub-gate electrode is formed on a second insulating layer 9 serving as a sub-gate insulating layer overlapping the first offset region 81.

The second TFT 102 will next be described. A second source region 52 and a second drain region 62 each containing impurities in high concentration and having a low resistance, and a second active region 72 and a second offset region 82 each hardly containing impurities are formed on a part of the semiconductor layer formed on the glass substrate 1 covered with the capping layer 2.

A third electrode 12 serving as a main-gate electrode is formed on a third insulating layer 10 serving as a main-gate insulating layer overlapping the second active region 72. Moreover, a fourth electrode 15 serving as a sub-gate electrode is formed on a fifth insulating layer 14 and the third insulating layer 10 serving as a sub-gate insulating layer overlapping the second offset region 82.

Switching of the first TFT 101 is performed by the first electrode 4 serving as a main-gate electrode. The first offset region 81 formed between the first active region 71 and the first drain region 61 serves as a buffer of a drain electric field. When a resistance of the first offset region 81 is set higher than that of the first active region 71, most part of the voltage between source and drain is applied to the first offset region 81, so that a high electric field can be prevented from being applied to the first active region 71.

The resistance of the first offset region 81 is controlled by the second electrode 11 serving as a sub-gate electrode. The drain electric field in lateral direction can be lowered by setting the voltage applied to the second electrode 11 to an appropriate value, so that a high-voltage thin-film transistor can be obtained.

On the other hand, switching of the second TFT 102 is performed by the third electrode 12 serving as a main-gate electrode. The second offset region 82 formed between the second active region 72 and the second drain region 62 serves as the buffer of the drain electric field. When a resistance of the second offset region 82 is set higher than that of the second active region 72, most part of the voltage between source and drain is applied to the second offset region 82, so that a high electric field can be prevented from being applied to the second active region 72.

The resistance of the second offset region 82 is controlled by the fourth electrode 15 serving as a sub-gate electrode. The drain electric field in lateral direction can be lowered by setting the voltage applied to the fourth electrode 15 to an appropriate value, so that a high-voltage TFT can be obtained.

When the first TFT 101 and the second TFT 102 constitute a circuit, operation of the circuit according to the present invention will next be described. In a case where the circuit generates an output voltage of V2[V] by an input signal of V0[V] and the medium voltage is set to V1 (nearly equal to V2/2), the first TFT 101 generates the output voltage of V1 by the input signal of V0 to the main-gate electrode, while the second TFT 102 generates the output voltage of V2 by the input signal of V1 to the main-gate electrode.

The processes of manufacturing the high-voltage TFT according to one embodiment of the present invention will be described with reference to FIGS. 3A to 3H.

Figure 3A:
FIGS. 3A to 3H are sectional views showing manufacture processes of a high-voltage thin-film transistor according to one embodiment of the present invention.

First, as shown in FIG. 3A, a capping layer 2 formed of a silicon dioxide film with thickness of 500 nm is formed on a glass substrate 1 by low-pressure chemical vapor deposition (LPCVD) method.

Figure 3B:
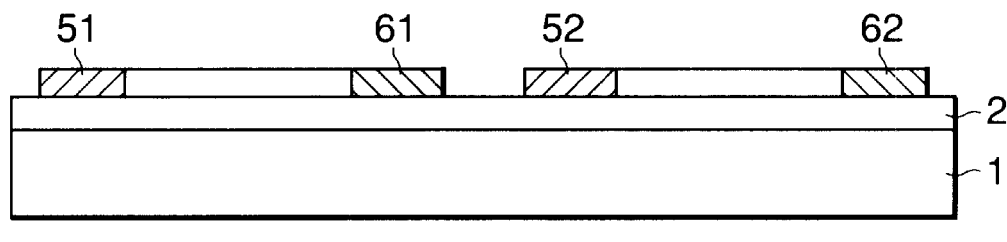

As shown in FIG. 3B, after a semiconductor film formed of a polycrystalline silicon with thickness of 100 nm is deposited on the capping layer 2 by LPCVD method, the semiconductor film is recrystallized by excimer laser annealing. About $10^{21}$ cm$^{-3}$ of phosphorus is doped in a part of the semiconductor layer constituting the first TFT 101 and the second TFT 102 by an ion doping method to form the first source region 51, the first drain region 61, the second source region 52 and the second drain region 62, whose sheet resistance is about 1 kΩ/□.

Figure 3C:
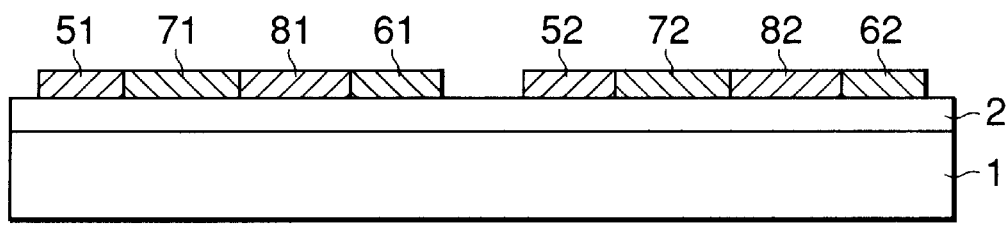

As shown in FIG. 3C, the first active region 71 and the first offset region 81 which hardly contain impurities are formed between the first source region 51 and the first drain region 61, while the second active region 72 and the second offset region 82 which hardly contain impurities are formed between the second source region 52 and the second drain region 62.

Figure 3D:
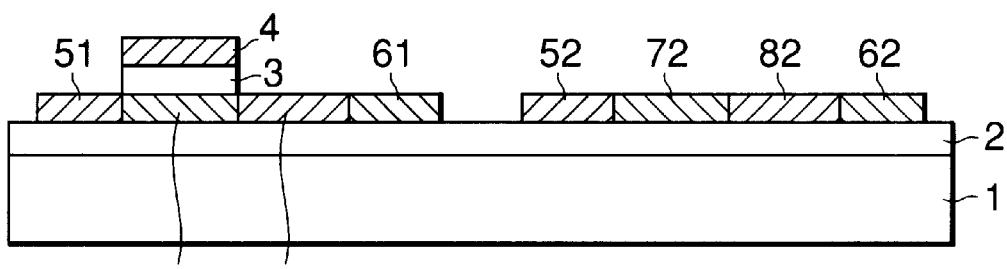

As shown in FIG. 3D, formed on the first active region 71 is the first insulating layer 3 which is formed of a silicon dioxide film with thickness of 100 nm by LPCVD method. The first insulating layer 3 serves as a main-gate insulating layer. Formed on the first insulating layer 3 is the first electrode 4 which is constituted by laminating an n-type polycrystalline silicon layer containing about $10^{21}$ cm$^{-3}$ of phosphorus with thickness of 50 nm formed by LPCVD method and a tungsten silicide layer with thickness of 200 nm formed by a sputtering method. The first electrode 4 serves as a main-gate electrode.

Figure 3E:
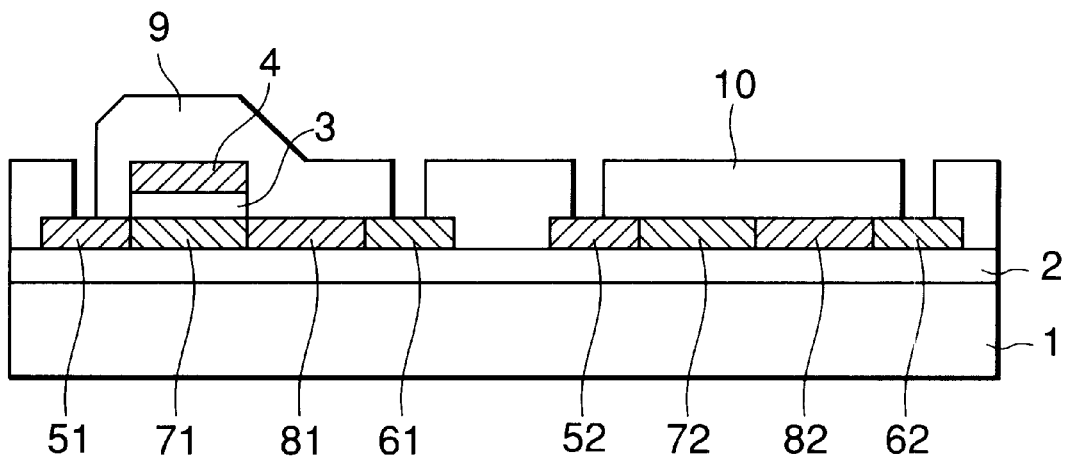

As shown in FIG. 3E, the second insulating layer 9 and the third insulating layer 10 each formed of a silicon dioxide film with thickness of 200 nm are formed on the first offset region 81 and on the second active region 72 and the second offset region 82 by LPCVD method. The second insulating layer 9 serves as a sub-gate insulating layer in the first TFT 101, while the third insulating layer 10 serves as a main-gate insulating layer in the second TFT 102. Furthermore, contact holes are formed.

Figure 3F:
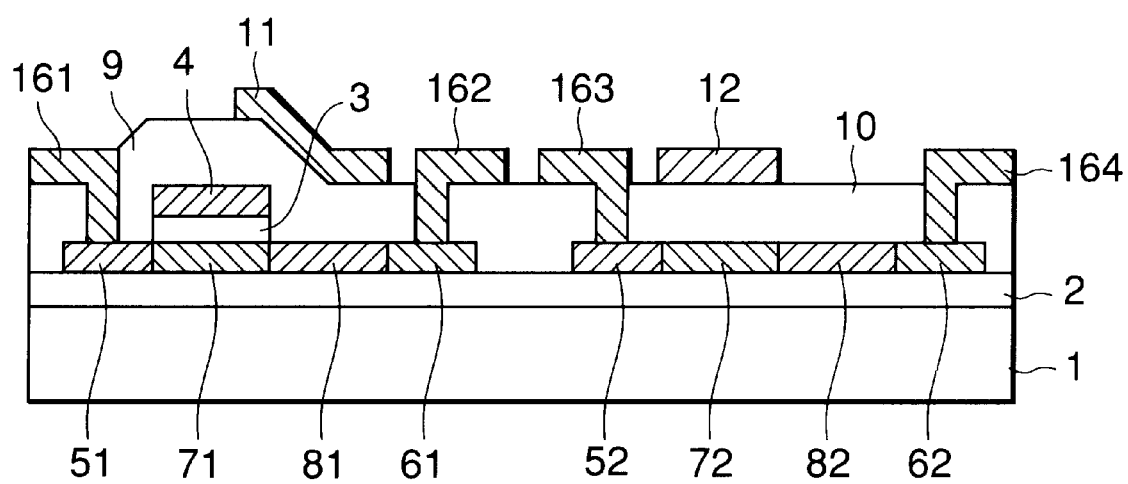

As shown in FIG. 3F, the second electrode 11 constituted of an aluminum film with thickness of 500 nm is formed on the second insulating layer 9 by the sputtering method to overlap the first offset region 81 of the first TFT 101, and the second electrode 11 serves as the sub-gate electrode. Moreover, the third electrode 12 constituted of an aluminum film with thickness of 500 nm is formed on the second active region 72 of the second TFT 102 by the sputtering method, and the third electrode 12 serves as a main-gate electrode.

Furthermore, a first source electrode 161, a first drain electrode 162, a second source electrode 163, and a second drain electrode 164 each constituted of an aluminum film with thickness of 500 nm are formed on the second insulating layer 9 and the third insulating layer 10 by the sputtering method in such a manner that they are electrically connected to the first source region 51, the first drain region 61, the second source region 52, and the second drain region 62 via the contact holes, respectively. These electrodes are used to supply signals to the first source region 51, the first drain region 61, the second source region 52, and the second drain region 62, respectively.

Figure 3G:
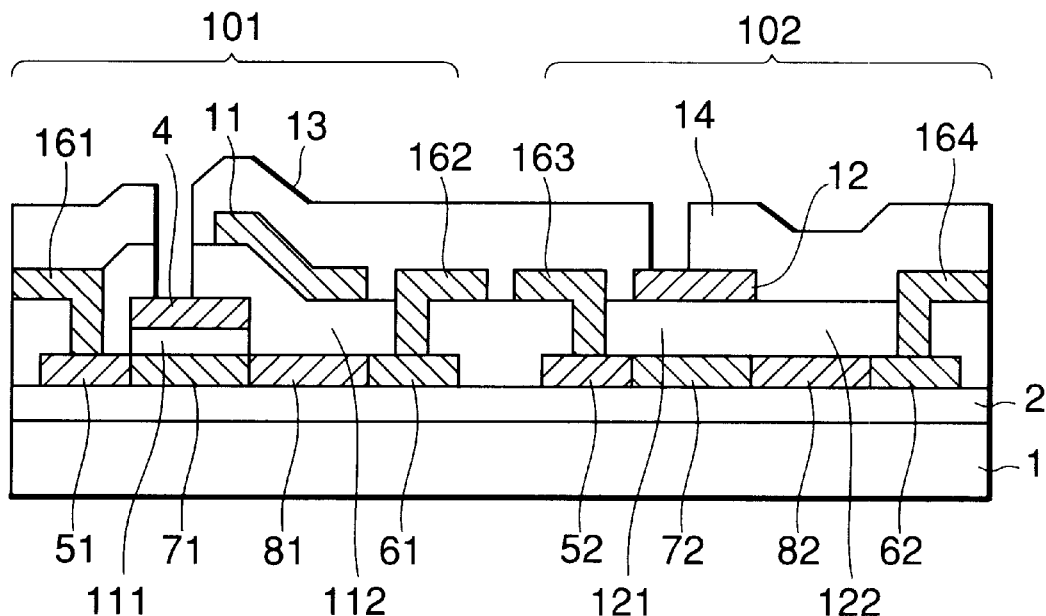

As shown in FIG. 3G, the fourth insulating layer 13 and the fifth insulating layer 14 each formed of a silicon nitride film with thickness of 300 nm are formed by a plasma chemical vapor deposition (P-CVD) method to cover the entire surface of the substrate. The fourth insulating layer 13 serves as a passivation layer in the first TFT 101, while the fifth insulating layer 14 serves as a part of sub-gate insulating layer in the second TFT 102. Furthermore, contact holes are formed.

Figure 3H:
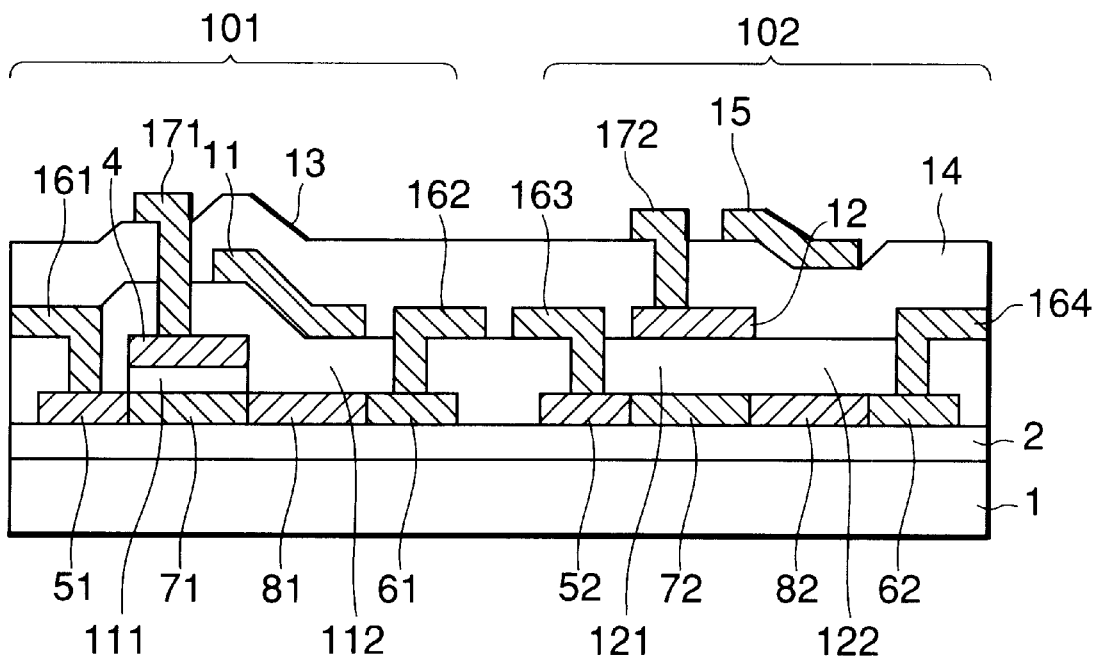

As shown in FIG. 3H, the fourth electrode 15 constituted of an aluminum film with thickness of 500 nm is formed on the fifth insulating layer 14 by the sputtering method to overlap the second offset region 82 of the second TFT 102, and the fourth electrode 15 serves as a sub-gate electrode. The sixth electrode 171 and the seventh electrode 172 each constituted of an aluminum film with thickness of 500 nm are formed on the fourth insulating layer 13 and the fifth insulating layer 14 by the sputtering method to electrically connect to the first electrode 4 and the third electrode 12, respectively. The sixth electrode 171 and the seventh electrode 172 are used to supply signals to the first electrode 4 and the third electrode 12 serving as the main-gate electrodes, respectively.

Here, thickness values of a first main-gate insulating layer 111 between the first active region 71 and the first electrode 4 of the first TFT 101 and a second main-gate insulating layer 121 between the second active region 72 and the third electrode 12 of the second TFT 102 are set to d1m, and d2m, respectively, and those of a first sub-gate insulating layer 112 between the first offset region 81 and the second electrode 11 of the first TFT 101 and a second sub-gate insulating layer 122 between the second offset region 82 and the forth electrode 15 of the second TFT 102 are similarly set to d1s, d2s, respectively. Then, in this embodiment, d1m=100 nm, d2m=200 nm, d1s=200 nm, d2S=500 nm, while d1s>d1m and d2s>d2m.

For the first TFT 101, the voltage of the first source electrode 161 is set to 0V, and the voltage of the first drain electrode 162 is set to 50V. In the first TFT 101, a signal of 50V can be controlled by setting the voltage of the second electrode 11 constant at 30V and transmitting a signal of 5V to the first electrode 4.

On the other hand, for the second TFT 102, the voltage of the second source electrode 163 is set to 0V, and the voltage of the second drain electrode 164 is set to 100V. In the second TFT 102, a signal of 100V can be controlled by setting the voltage of fourth electrode 15 constant at 70V and transmitting a signal of 50V to the third electrode 12.

As described above, the input of the signal of 5V to the first electrode 4 of the first TFT 101 enables the second TFT 102 to output the signal of 100V in the second TFT 102.

In this case, there is a difference of 25V in electric potential between the main-gate and the sub-gate electrode in the first TFT 101. On the other hand, there is a difference of 20V in electric potential between the main-gate and the sub-gate electrode in the second TFT 102. Since the voltage between main-gate and sub-gate electrode can thus be lowered, the insulating layer between the main-gate and the sub-gate can be formed as thin as 200 to 300 nm.

When the insulating layer formed between the main-gate and the sub-gate electrode is thinned, the sub-gate insulating layer can be thinned, and the resistance of the offset region can be lowered. Therefore, ON current about twice as large as in the conventional art can be obtained.

The second insulating layer 9 serves as the sub-gate insulating layer of the first TFT 101, while the third insulating layer 10 formed simultaneously with the second insulating layer 9 serves as the main-gate insulating layer of the second TFT 102. Therefore, the process of forming the insulating layers can be simplified.

Since the second electrode 11 as the sub-gate electrode of the first TFT 101 and the third electrode 12 as the main-gate electrode of the second TFT 102 can be formed in the same process, the process of forming the electrodes can be simplified.

As described above, according to the present invention, the high-voltage thin-film transistor which can obtain high ON current can be prepared by the minimum number of processes.

Additionally, in the embodiment of the present invention, TFT having NMOS structure has been described. However, it is needless to say that even TFT with PMOS structure or TFT with CMOS structure can provide the same effect.

What is claimed is:

1. A high-voltage thin-film transistor comprising on one of the same insulating substrate and the same insulating layer:

a first thin-film transistor comprising a first active region, a first offset region, a first source region and a first drain region formed in the same layer as said first active region, a first insulating layer formed to cover said first active region, a first electrode formed on said first insulating layer overlapping said first active region, a second insulating layer formed to cover at least said first offset region, and a second electrode formed on said second insulating layer overlapping said first offset region, said first electrode being formed as a main-gate electrode, said second electrode being formed as a sub-gate electrode; and a second thin-film transistor comprising a second active region, a second offset region, a second source region and a second drain region formed in the same layer as said second active region, a third insulating layer formed to cover said second active region, a third electrode formed on said third insulating layer overlapping said second active region, a fourth insulating layer formed to cover at least said second offset region, and a fourth electrode formed on said fourth insulating layer overlapping said second offset region, said third electrode being formed as a main-gate electrode, said fourth electrode being formed as a sub-gate electrode, said second insulating layer and said third insulating layer being formed in the same layer.

2. The high-voltage thin-film transistor according to claim 1 wherein when thickness of the insulating layer between said first active region and said first electrode is d1m, thickness of the insulating layer between said second active region and said third electrode is d1s, thickness of the insulating layer between said first offset region and said second electrode is d2m, and thickness of the insulating layer between said second offset region and said forth electrode is d2s, respectively, they are formed to have the relationship of d1s>d1m and d2s>d2m.

3. The high-voltage thin-film transistor according to claim 1 or 2 wherein said second electrode and said third electrode are formed in the same layer.

* * * * *